United States Patent
Takakusagi et al.

(10) Patent No.: US 6,888,488 B2
(45) Date of Patent: May 3, 2005

(54) A/D CONVERTER WITH REDUCED POWER CONSUMPTION

(75) Inventors: Hiroshi Takakusagi, Kawasaki (JP); Toshitaka Mizuguchi, Kawasaki (JP); Chikara Tsuchiya, Kawasaki (JP); Katsuyosi Yamamoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/304,756

(22) Filed: Nov. 27, 2002

(65) Prior Publication Data

US 2003/0112169 A1 Jun. 19, 2003

(30) Foreign Application Priority Data

Dec. 17, 2001 (JP) .................................... 2001-383724

(51) Int. Cl.[7] .................................................. H03M 1/36
(52) U.S. Cl. ...................... 341/159; 341/155; 341/156; 341/158
(58) Field of Search .................................. 341/155–159

(56) References Cited

U.S. PATENT DOCUMENTS

| | | | | |
|---|---|---|---|---|
| 4,539,551 A | * | 9/1985 | Fujita et al. ................. | 341/118 |
| 4,745,393 A | * | 5/1988 | Tsukada et al. .............. | 341/136 |
| 4,794,374 A | * | 12/1988 | Koike .......................... | 341/120 |
| 4,845,383 A | * | 7/1989 | Iida .............................. | 327/91 |
| 4,893,124 A | * | 1/1990 | Tsuji et al. ................... | 341/156 |
| 4,999,630 A | * | 3/1991 | Masson ........................ | 341/120 |
| 5,165,058 A | * | 11/1992 | Nakatani et al. ............. | 341/158 |
| 5,291,198 A | * | 3/1994 | Dingwall et al. ............ | 341/159 |
| 5,349,354 A | * | 9/1994 | Ito et al. ....................... | 341/156 |
| 5,397,936 A | * | 3/1995 | Wang ............................ | 327/77 |
| 5,450,085 A | * | 9/1995 | Stewart et al. ............... | 341/159 |
| 5,543,794 A | * | 8/1996 | Kanzaki ....................... | 341/161 |
| 6,459,399 B1 | * | 10/2002 | Nozaki ......................... | 341/155 |

* cited by examiner

*Primary Examiner*—Michael Tokar
*Assistant Examiner*—Khai M. Nguyen
(74) *Attorney, Agent, or Firm*—Arent Fox PLLC

(57) ABSTRACT

An A/D converter includes a plurality of comparators, each of which samples an analog input potential during a first period, and compares the analog input potential with a reference potential during a second period, an encoder which encodes comparison results obtained by the comparators, and a control signal supply unit which generates one or more control signals that define the first period and the second period such as to make a duration of the first period different from a duration of the send period, and supplies the one or more control signals to the plurality of comparators.

14 Claims, 8 Drawing Sheets

US 6,888,488 B2

A/D CONVERTER WITH REDUCED POWER CONSUMPTION

BACKGROUND OF THE INVENTION

1. Field of the Invention

The present invention generally relates to A/D converters and systems having A/D (analog-to-digital) converters, and particularly relates to a parallel-type A/D converter and a system having such a parallel-type A/D converter.

2. Description of the Related Art

A parallel-type A/D converter of an 8-bit configuration, for example, includes 255 converters, each of which receives respective reference potentials obtained by a resister-based potential divider. These 255 converters compare the respective reference potentials with an input potential, thereby converting the input potential into a digital value.

FIG. 1 is a circuit diagram showing a configuration of a comparator used in a parallel-type A/D converter.

The comparator of FIG. 1 includes a PMOS transistor 11, an NMOS transistor 12, a buffer 13, an inverter 14, switches S1 through S3, and a condenser C1. The buffer 13 and the inverter 14 generate control signals Φ1 and Φ2, respectively, from a clock signal CLK. By ignoring a slight delay, the control signal Φ1 can be regarded as having the same phase as the clock signal CLK, and the control signal Φ2 can be regarded as having the opposite phase to the clock signal CLK. The control signal Φ1 is supplied to the switches S1 and S3, and closes the switches S1 and S3 when the clock signal CLK is HIGH. The control signal Φ2 is supplied to the switch S2, and closes the switch S2 when the clock signal CLK is LOW.

When the switch S3 is closed to provide a path in response to the HIGH period of the clock signal CLK, the inverter comprised of the PMOS transistor 11 and the NMOS transistor 12 has the input thereof and the output thereof coupled together, so that a through electric current runs through the PMOS transistor 11 and the NMOS transistor 12 from a power supply potential VDD to the ground potential. When this happens, a potential at the input and output nodes of the inverter is set to VDD/2. The switch S1 is also closed at this time, thereby allowing an input potential VIN to charge the condenser C1.

When the switches S1 and S3 are open to sever the paths in response to the LOW period of the clock signal CLK, the switch S2 is closed to provide a path. The end of the condenser C1 that is connected to the switch S2 is set to a reference potential generated by a resistor series including resistors R1 and R2. This reference potential is lowered by the potential corresponding to the amount of electric charge accumulated in the condenser C1 (i.e., corresponding to the input potential VIN), followed by being supplied to the gates of the PMOS transistor 11 and the NMOS transistor 12.

If the input potential VIN is lower than the reference voltage, an output potential VOUT is set to LOW. If the input potential VIN is higher than the reference voltage, the output potential VOUT is set to HIGH. A plurality of output potentials VOUT output from the respective comparators arranged in parallel are then encoded and sampled, thereby performing A/D conversion.

As systems are implemented as LSI, nowadays, parallel-type A/D converters are beginning to be used in various frequencies. In order to satisfy such needs, a single A/D converter needs to cover a wide range of frequencies from a lower frequency to a higher frequency. To this end, provision has to be made to elongate the gate widths of the PMOS transistor 11 and the NMOS transistor 12, thereby allowing an electric current to freely flow even at high frequency.

If a configuration is made such as to be operable at high frequency, it will give rise to a problem in that the through electric current described above increases, resulting in large power consumption. An increase in power consumption at high frequency may have to be accepted as an unavoidable cost. At low frequency, however, there is no need to have a large current running through the circuit, and it is desirable to have as low power consumption as possible.

Power consumption by the through current running through the PMOS transistor 11 and the NMOS transistor 12 is constant in the parallel-type A/D comparator regardless of whether the operation frequency is high or low. Namely, the through current is present to incur power consumption during the HIGH period of the clock signal CLK, i.e., during half the total operation time, regardless of HIGH or LOW of the operation frequency.

In this manner, a configuration that is operable at higher frequency comes with a cost that power consumption increases also at lower frequency.

Accordingly, there is a need for an A/D comparator which is operable at higher frequency and operates with reduced power consumption at lower frequency, and there is also a need for a system including such an A/D comparator.

SUMMARY OF THE INVENTION

It is a general object of the present invention to provide an A/D converter that substantially obviates one or more of the problems caused by the limitations and disadvantages of the related art.

Features and advantages of the present invention will be set forth in the description which follows, and in part will become apparent from the description and the accompanying drawings, or may be learned by practice of the invention according to the teachings provided in the description. Objects as well as other features and advantages of the present invention will be realized and attained by an A/D converter particularly pointed out in the specification in such full, clear, concise, and exact terms as to enable a person having ordinary skill in the art to practice the invention.

To achieve these and other advantages and in accordance with the purpose of the invention, as embodied and broadly described herein, the invention provides an A/D converter, including a plurality of comparators, each of which samples an analog input potential during a first period, and compares the analog input potential with a reference potential during a second period, an encoder which encodes comparison results obtained by the comparators, and a control signal supply unit which generates one or more control signals that define the first period and the second period such as to make a duration of the first period different from a duration of the send period, and supplies the one or more control signals to the plurality of comparators.

In the invention described above, the first period that is an analog sample period is set to a different length than the second period that is a comparison period, so that the analog sample period can be shortened to reduce a time length during which through currents run through the comparators. The analog sample period is sufficient if this period allows a condenser to accumulate electric charge corresponding to the input potential. It follows that the proportion of the analog sample period in the clock cycle can become smaller as the operation frequency is lowered. When the operation frequency is low, therefore, the time period during which the through current flows is made relatively shorter by refraining from spending too much time for the charging of the condenser, thereby reducing power consumption in the A/D converter.

Further, a system according to the present invention includes an A/D converter which converts an analog input signal into a digital signal, a digital processing unit which processes the digital signal output from the A/D converter, and a pulse-width adjustment unit, wherein the A/D converter includes a plurality of comparators, each of which samples an analog input potential during a first period, and compares the analog input potential with a reference potential during a second period, an encoder which encodes comparison results obtained by the comparators, and a control signal supply unit which generates one or more control signals that define the first period and the second period such as to make a duration of the first period different from a duration of the send period, and supplies the one or more control signals to the plurality of comparators, wherein the pulse-width adjustment unit is configured to adjust the duration of the first period.

In the invention described above, the duration of the first period is adjustable, thereby making it possible to control power consumption in the A/D converter. The invention thus achieves an efficient system operation by avoiding excessive power consumption caused by too long a charging period at low operation frequency.

Further, the invention provides a comparator which samples an analog input potential during a first period, and compares the analog input potential with a reference potential during a second period The comparator includes a condenser, an inverter connected to a first end of the condenser, a first switch connecting between a second end of the condenser and the analog input potential, a second switch connecting between the second end of the condenser and the reference potential, and a third switch which couples together an input of the inverter and an output of the inverter, wherein the first switch and the third switch are closed during the first period and the second switch is closed during the second period, the first period and the second period being controlled such as to have different lengths from each other.

In the invention described above, the first period that is the analog sample period is different in duration from the second period that is the comparison period, thereby reducing the analog sample period to shorten a time length during which a through current flows through the comparator. When the operation frequency is low, therefore, the time period during which the through current flows is made relatively shorter by refraining from spending too much time for the charging of the condenser, thereby reducing power consumption in the comparator.

Other objects and further features of the present invention will be apparent from the following detailed description when read in conjunction with the accompanying drawings.

DESCRIPTION OF THE PREFERRED EMBODIMENTS

In the following, embodiments of the present invention will be described with reference to the accompanying drawings.

Figure 1:
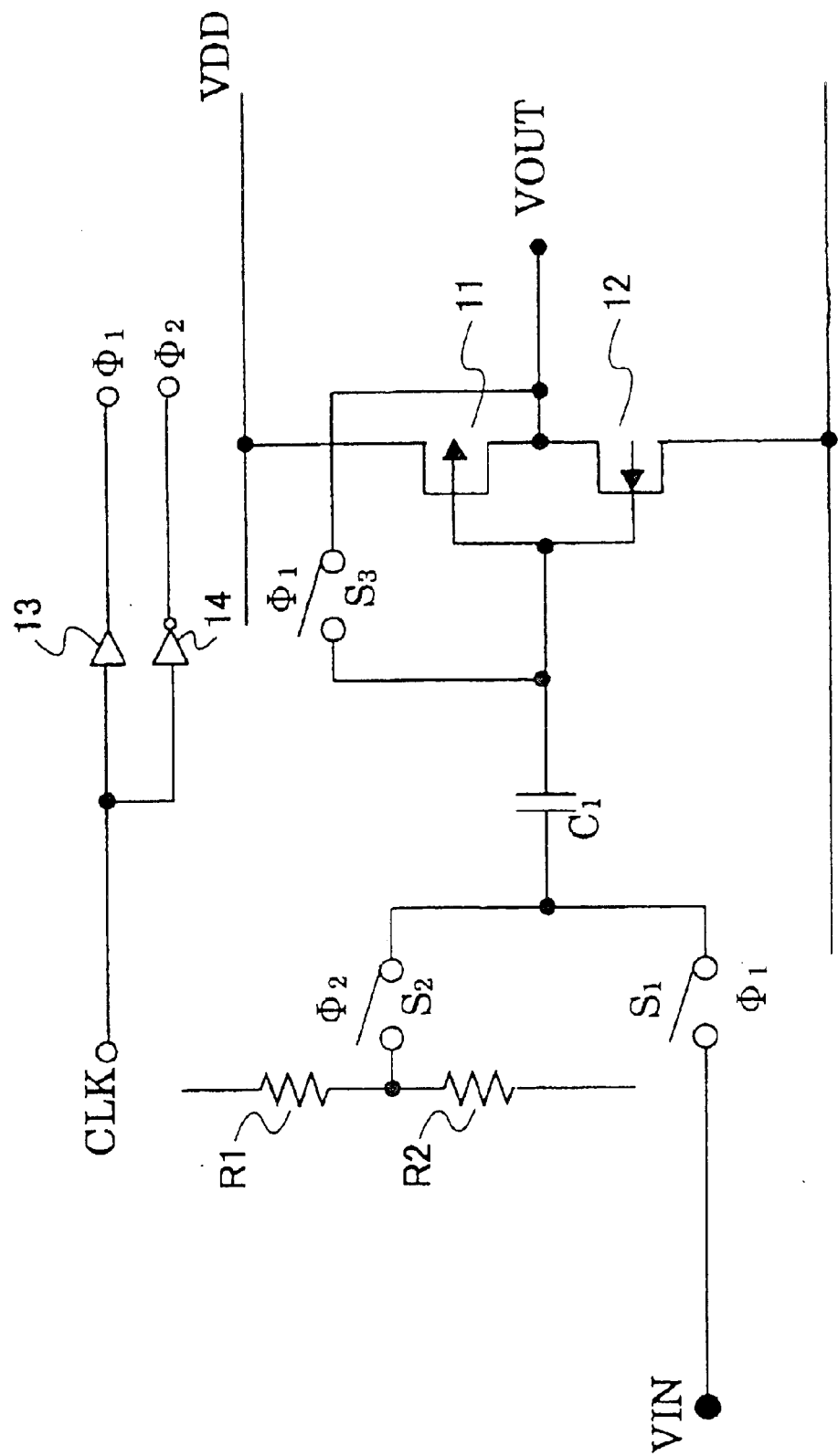
FIG. 1 is a circuit diagram showing a configuration of a comparator used in a related-art parallel-type A/D converter.
Figure 2:
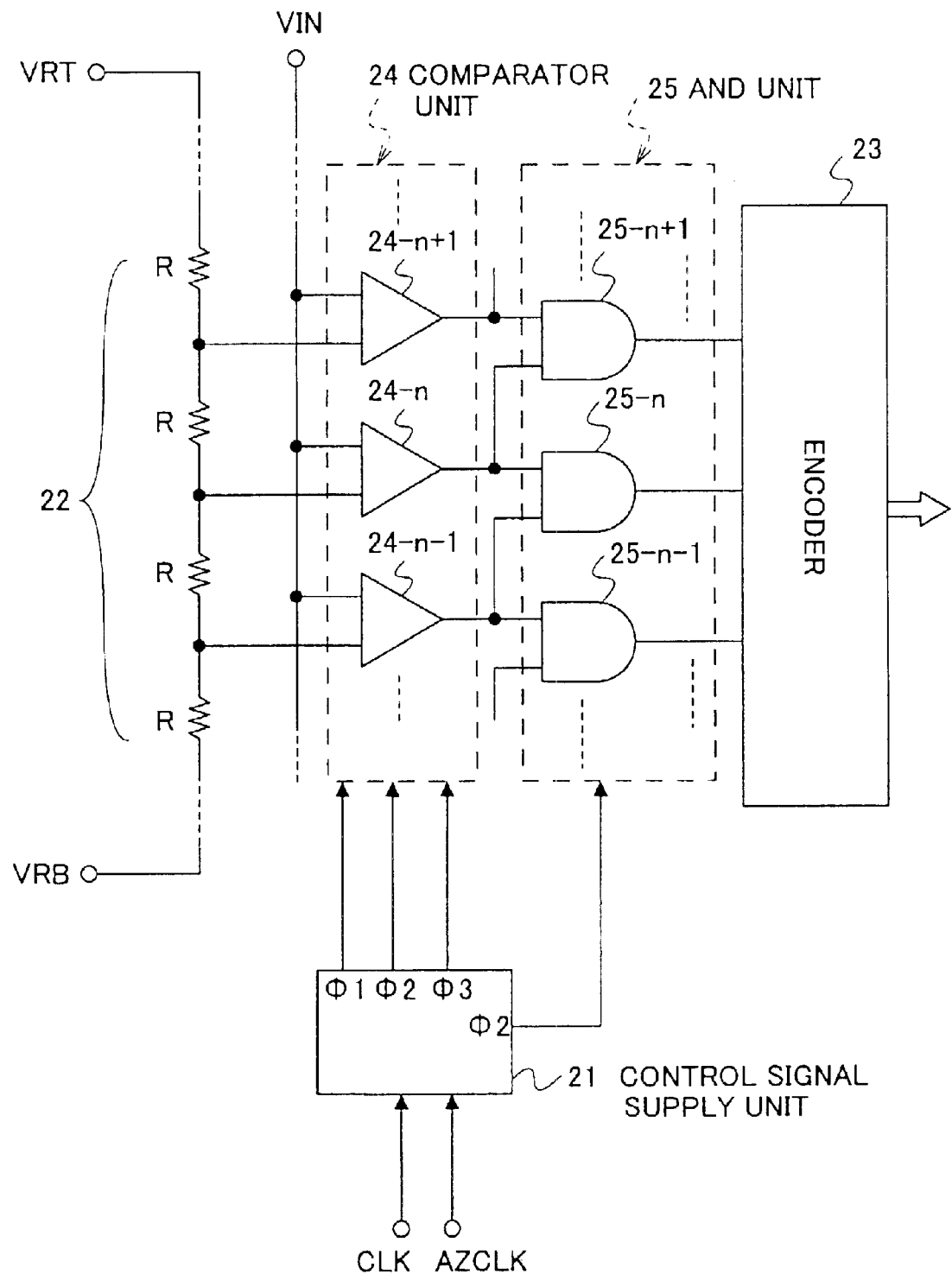
FIG. 2 is a circuit diagram showing a configuration of a parallel-type A/D converter according to the present invention.

FIG. 2 is a circuit diagram showing a configuration of a parallel-type A/D converter according to the present invention.

The A/D converter of FIG. 2 includes a control signal supply unit 21, a potential divider circuit 22, an encoder 23, a comparator unit 24, and an AND unit 25. The potential divider circuit 22 includes a series of resistors R for dividing the potential between a potential VRT and a potential VRB. Divided potentials obtained at joint points between resistors are supplied to the comparator unit 24 as reference potentials.

The comparator unit 24 includes a plurality of comparators (only 24-n−1, 24-n, and 24-n+1 are shown in FIG. 2) where each comparator receives a corresponding one of the reference voltages from the potential divider circuit 22. Each comparator operates based on the control signals $\Phi 1$ through $\Phi 3$ supplied form the control signal supply unit 21 to compare the input potential VIN with the corresponding reference potential. The comparison results are supplied to the AND unit 25.

The AND unit 25 includes a plurality of And circuits (only 25-n−1, 25-n, and 25-n+1 are shown in FIG. 2), and performs AND operations between the signals indicative of the comparison results supplied from the comparator unit 24, hereby providing outputs to the encoder 23. Provision may be made to sample the output signals of the comparator unit 24 at the timing corresponding to the HIGH period of the control signal 101 2 and to hold these signals at the timing corresponding to the LOW period of the control signal $\Phi 2$ based on the control signal $\Phi 2$ supplied from the control signal supply unit 21.

The encoder 23 encodes the signals output from the AND unit 25 to output a digital value that represents the input potential VIN.

Figure 3:
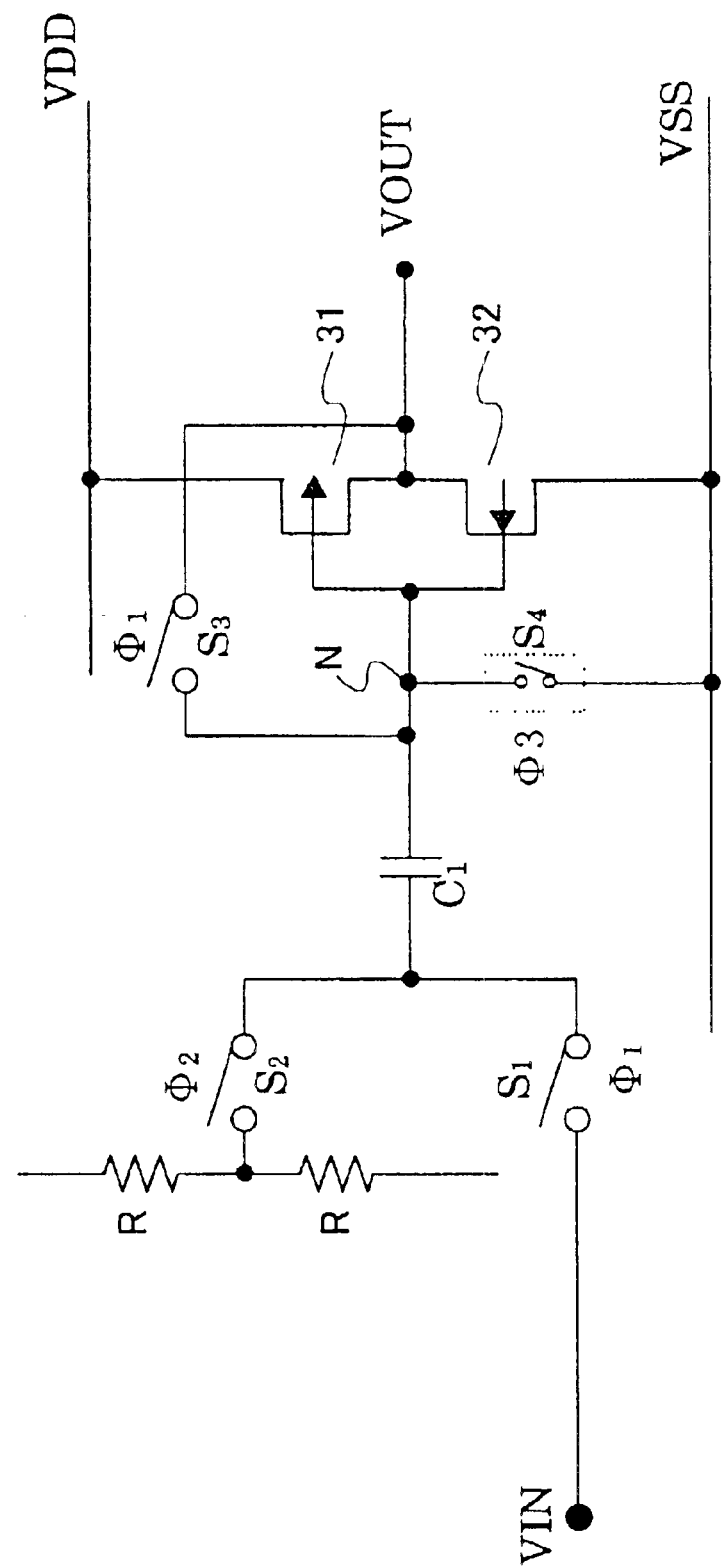
FIG. 3 is a circuit diagram showing a comparator according to the present invention.

FIG. 3 is a circuit diagram showing a comparator according to the present invention.

The comparator of FIG. 3 corresponds to each comparator of the comparator unit 24 of FIG. 2, and includes a PMOS transistor 31, an NMOS transistor 32, switches S1 through S4, and a condenser C1.

Figure 4:
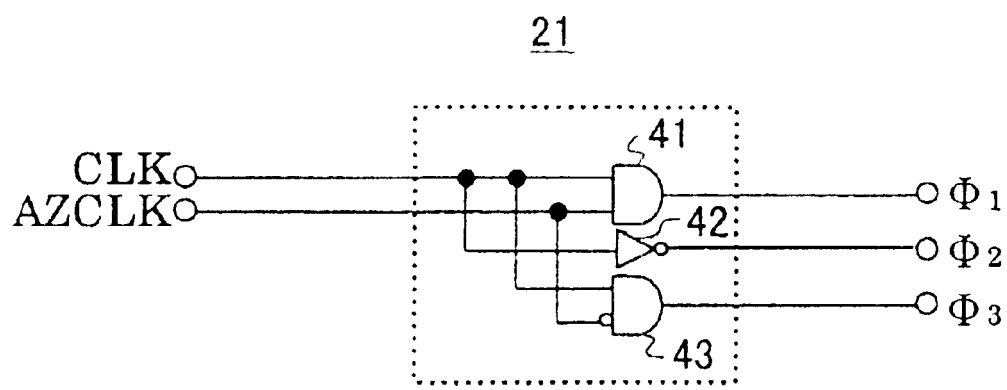
FIG. 4 is a circuit diagram showing a configuration of a control signal supply unit.

FIG. 4 is a circuit diagram showing a configuration of the control signal supply unit 21.

The control signal supply unit 21 of FIG. 4 includes an AND circuit 41, an inverter 42, and an AND circuit 43 where one of the two inputs of the AND circuit 43 is a negative logic input. The control signal Φ1 is an AND logic between the clock signal CLK and an analog sample signal AZCLK. The control signal Φ2 is an inverse of the clock signal CLK. The control signal Φ3 is an AND logic between an inverse of the analog sample signal AZCLK and the clock signal CLK.

Figure 5:
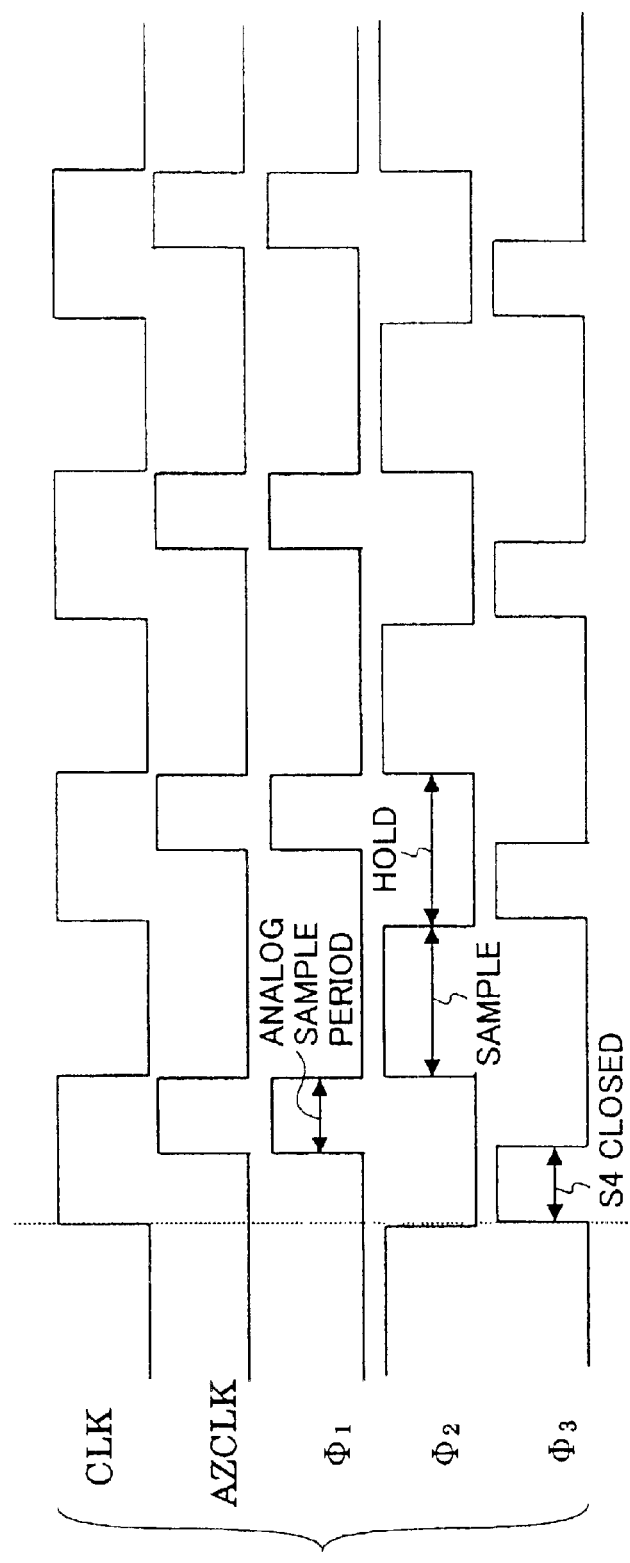
FIG. 5 is a timing chart showing signals and the timing relations between the signals.

FIG. 5 is a timing chart showing signals and the timing relations between these signals.

The analog sample signal AZCLK defines a time period during which the analog input potential VIN is sampled. In the present invention, a portion of the HIGH period of the clock signal CLK is assigned as the analog sample period. The control signal Φ1 is an AND logic between the clock signal CLK and the analog sample signal AZCLK, and becomes HIGH only during the analog sample period that is part of the HIGH period of the clock signal CLK. The control signal Φ2 is an inverse of the clock signal CLK. The control signal Φ3 is an AND logic between an inverse of the analog sample signal AZCLK and the clock signal CLK, and becomes HIGH only during a period other than the analog sample period within the HIGH period of the clock signal CLK.

As shown in FIG. 3, the control signal Φ1 is supplied to the switches S1 and S3, thereby closing the switches S1 and S3 during the analog sample period within the HIGH period of the clock signal CLK. The control signal Φ2 is supplied to the switch S2, which is thus closed during the LOW period of the clock signal CLK. The control signal Φ3 is supplied to the switch S4, thereby closing the switch S4 during the period other than the analog sample period within the HIGH period of the clock signal CLK.

When the clock signal CLK is HIGH, the control signal Φ3 is the first to change to HIGH, which closes the switch S4. In response to the closing of the switch S4, a node N is coupled to the ground potential VSS, resulting in the potential of the node N becoming the ground potential. During this period, therefore, the NMOS transistor 32 becomes nonconductive, with no through current running therethrough. During the HIGH period of the clock signal CLK, the control signal Φ1 is the next to change to HIGH, thereby closing the switches S1 and S3. At this time, the switches S2 and S4 are open. In response to the closure of the switch S3, the input and output of the inverter comprised of the PMOS transistor 31 and the NMOS transistor 32 are coupled together, so that a through current runs through the PMOS transistor 31 and the NMOS transistor 32 from the power supply potential VDD to the ground potential. The potential at the input and output nodes of the inverter is set to VDD/2. During this period, the switch S1 is closed, so that the condenser C1 is charged by the input potential VIN.

During the LOW period of the clock signal CLK, the control signal Φ2 is HIGH, so that the switch S2 is closed. The switches S1, S3, and S4 are all open at this time. The end of the condenser C1 that is coupled to the switch S2 is set to a reference potential generated by the series of resistors R in the potential divider circuit 22. This reference potential is lowered by the potential corresponding to the amount of electric charge accumulated in the condenser C1 (i.e., corresponding to the input potential VIN), followed by being supplied to the gates of the PMOS transistor 31 and the NMOS transistor 32.

If the input potential VIN is lower than the reference potential, an output potential VOUT is set to LOW. If the input potential VIN is higher than the reference potential, the output potential VOUT is set to HIGH. As shown in FIG. 2, the outputs of the comparators arranged in parallel are then encoded, thereby performing A/D conversion.

In the A/D converter of the present invention as described above, only a portion of the HIGH period of the clock signal CLK is assigned as an analog sample period, and the remaining period is provided as a period during which no through current flows through the comparator. The analog sample period, i.e., the HIGH period of the analog sample signal AZCLK, is sufficient if this period allows the condenser C1 to accumulate electric charge corresponding to the input potential VIN. It follows that the proportion of the analog sample period in half the cycle of the clock signal CLK can become smaller as the operation frequency is lowered. When the operation frequency is low, therefore, the time period during which the through current flows is made relatively shorter by refraining from spending too much time for the charging of the condenser, thereby reducing power consumption in the A/D converter.

In the following, consideration is given to power consumption in an example in which an A/D converter includes 16 comparators.

During the analog sample period that corresponds to the HIGH period of the control signal Φ1, a through current continues to flow, and power is consumed by all the 16 comparators in which the through currents run through the inverters. During the comparison period that corresponds to the HIGH period of the control signal Φ2, the potential at the node N is around VDD/2 in a few of the comparators. Therefore, power consumption by the inverter through current may be present in 6 or so comparators, for example, among the total of 16 comparators.

During a period in which both the control signals Φ1 and Φ2 are LOW, without grounding through the switch S4, the node N will have a residue of the potential from the comparison period because of the effect of parasitic capacitance. The inverter through current is thus present in the number of comparators about the same as during the comparison period. In the present invention, however, the switch S4 is closed, so that the through current is nonexistent during the period in which both the control signals Φ1 and Φ2 are LOW.

Figure 6:
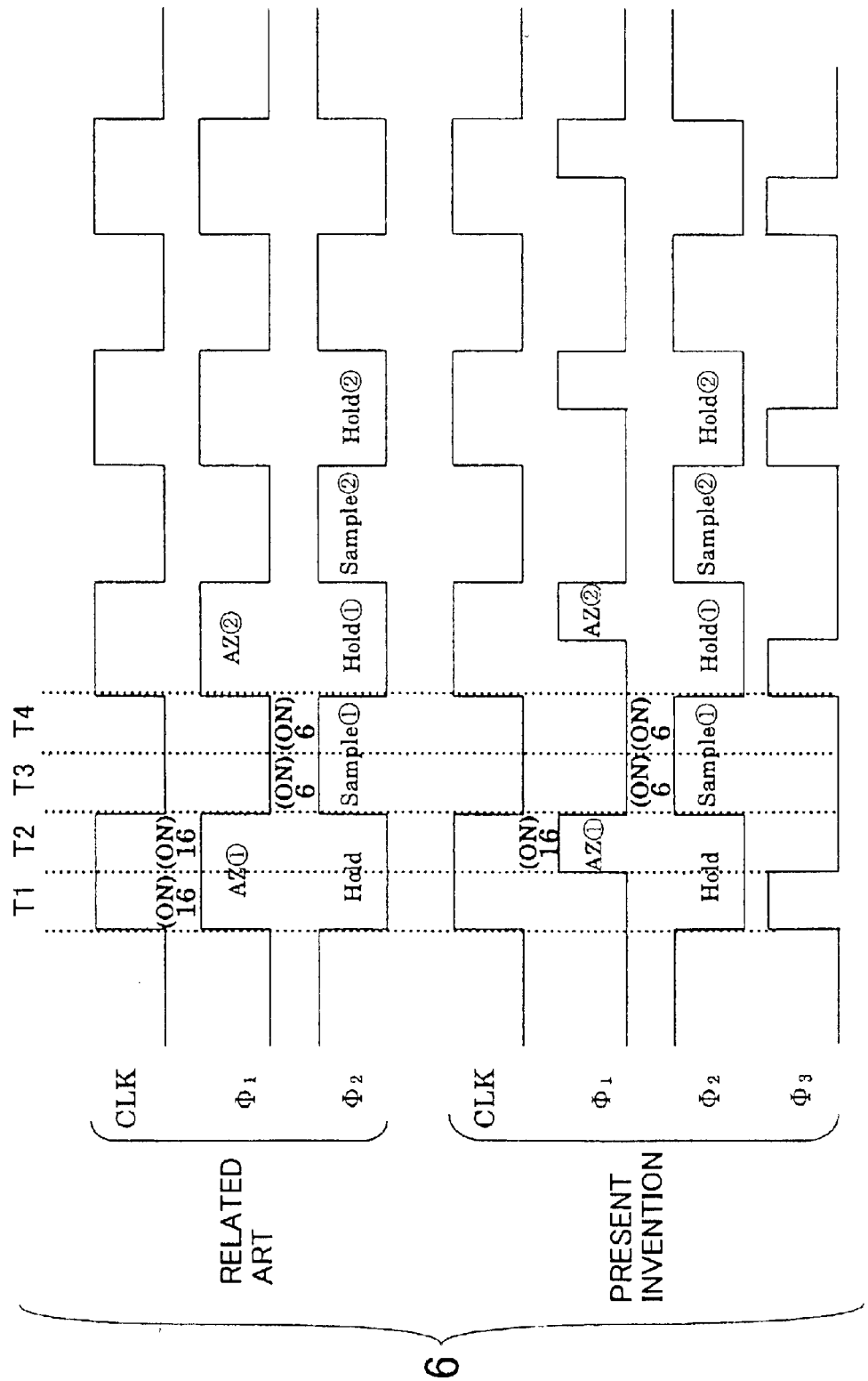
FIG. 6 is a signal chart for showing comparison between the related-art configuration and the present invention with regard to the number of comparators in which through currents flow.

FIG. 6 is a signal chart for showing comparison between the related-art configuration and the present invention with regard to the number of comparators in which through currents flow.

As shown in FIG. 6, one cycle of the clock signal CLK is divided into four sub-periods T1, T2, T3, and T4 for the sake of explanation. In the related-art configuration, through currents flow in all the 16 comparators during both the sub-period T1 and the sub-period T2 of the HIGH period of the clock signal CLK. During the LOW period of the clock signal CLK, through currents flow in 6 or so comparators, for example, among the total of 16 comparators during both the sub-period T3 and the sub-period T4. Accordingly, the total number of comparators that operate during one clock cycle of the clock signal CLK is 44 (=16+16+6+6).

In the configuration of the present invention, when the HIGH period of the clock signal CLK is considered, through currents do not flow in any comparators during the sub-period T1, but do flow in all the 16 comparators during the sub-period T2. During the LOW period of the clock signal CLK, through currents flow in 6 or so comparators, for example, among the total of 16 comparators during both the sub-period T3 and the sub-period T4. Accordingly, the total number of comparators that operate during one clock cycle of the clock signal CLK is 28 (=16+6+6). Reduction in power consumption is thus 36.3% (=(44−28)/44×100). In this analysis, the HIGH period of the control signal Φ1 is half the HIGH period of the clock signal CLK. When the HIGH period of the control signal Φ1 is shortened, however, further reduction in power consumption can be obtained.

Figure 7:
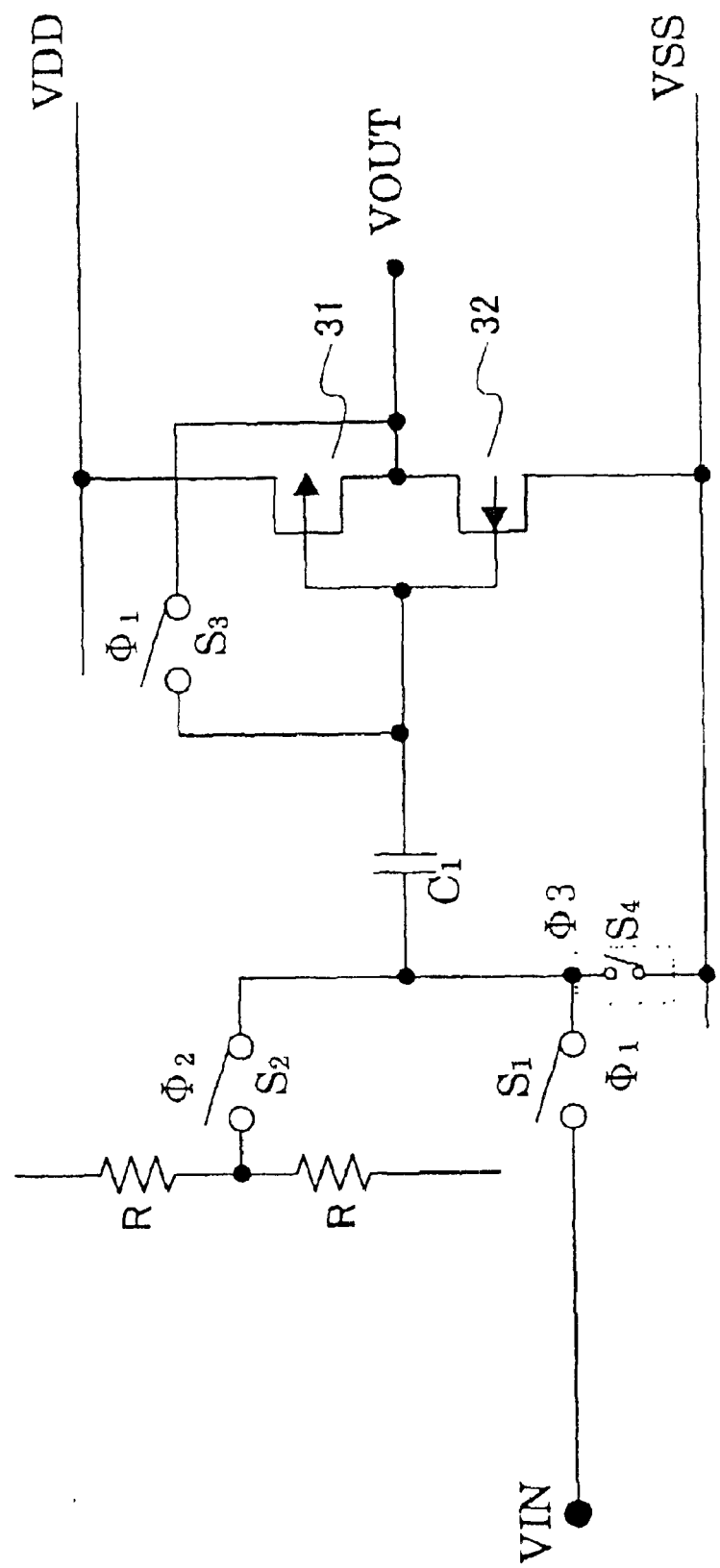
FIG. 7 is a circuit diagram showing a variation of the comparator according to the present invention.

FIG. 7 is a circuit diagram showing a variation of the comparator according to the present invention.

The comparator of FIG. 7 corresponds to one of the comparators of the comparator unit 24 shown in FIG. 2, and includes a PMOS transistor 31, an NMOS transistor 32, switches S1 through S4, and a condenser C1. In comparison with the comparator of FIG. 3, the comparator of FIG. 7 has the same configuration, except for the position of the switch S4. The control signals Φ1 through Φ3 for controlling the switches S1 through S4 are generated by the circuit of FIG. 4.

During the HIGH period of the clock signal CLK, the control signal Φ3 is the first to change to HIGH so as to close the switch S4. In response to the closure of the switch S4, the node N is coupled to the ground potential VSS via the condenser C1. During this period, therefore, the NMOS transistor 32 is open, thereby allowing no through current to flow through. Subsequent operations are the same as those of the comparator of FIG. 3.

Figure 8:
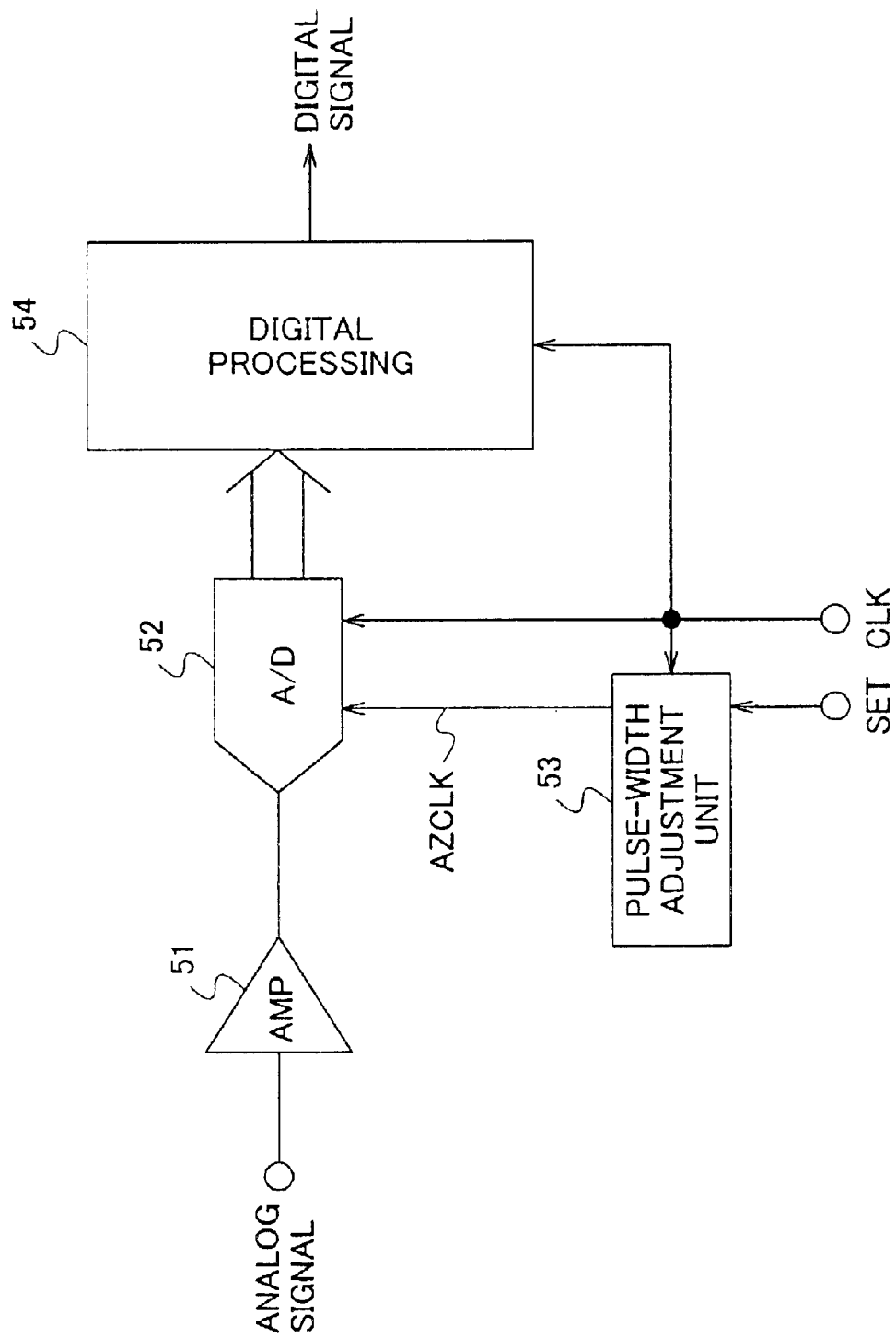
FIG. 8 is a block diagram showing an example of an A/D conversion and digital processing system according to the present invention.

FIG. 8 is a block diagram showing an example of an A/D conversion and digital processing system according to the present invention.

The A/D conversion and digital processing system of FIG. 8 includes an amplifier 51, an A/D converter 52, a pulse-width adjustment unit 53, and a digital processing unit 54. The A/D converter 52 corresponds to the A/D converter of the present invention shown in FIG. 2.

The amplifier 51 amplifies an input analog signal, and the A/D converter 52 converts the analog signal into a digital signal. The digital signal obtained by the A/D conversion is processed by the digital processing unit 54. The A/D converter 52 and the digital processing unit 54 operate at the frequency of the clock signal CLK.

The pulse-width adjustment unit 53 receives the clock signal CLK and a pulse-width setting signal SET. The pulse-width setting signal SET determines the pulse width of the control signal AZCLK indicative of the analog sample period. For example, the pulse width of the control signal AZCLK may be specified by its proportion relative to one cycle of the clock signal CLK. Alternatively, the pulse width of the control signal AZCLK may be specified by a unit of time. The pulse-width adjustment unit 53 adjusts the length of the HIGH period of the clock signal CLK according to the pulse-width setting signal SET so as to generate the control signal AZCLK. The control signal AZCLK generated in this manner is supplied to the A/D converter 52 together with the clock signal CLK.

In the system of the present invention as described above, the pulse width of a signal that controls the A/D converter is adjustable, making it possible to control power consumption in the A/D converter. The present invention thus achieves an efficient system operation by avoiding excessive power consumption caused by too long a charging period at low operation frequency.

In the embodiments described above, the LOW period of the clock signal is assigned as a comparison period, and a portion of the HIGH period of the clock signal is assigned as an analog sample period, with the remaining portion being set aside as a grounding period through a switching operation. The present invention is not limited to this configuration. For example, one cycle of the clock signal may be divided into an analog sample period and a comparison period, and the ratio between the analog sample period and the comparison period is set to a ratio different from 1:1 by control signals supplied to the comparator such as to make the analog sample period shorter than the comparison period. In this case, current consumption may be increased compared to the case in which the grounding period as described above is provided, but power consumption will be smaller in comparison with the related-art configuration.

Further, the present invention is not limited to these embodiments, but various variations and modifications may be made without departing from the scope of the present invention.

The present application is based on Japanese priority application No. 2001-383724 filed on Dec. 17, 2001, with the Japanese Patent Office, the entire contents of which are hereby incorporated by reference.

What is claimed is:

1. An A/D converter, comprising:

a plurality of comparators, each of which samples an analog input potential during a first period, and compares the analog input potential with a reference potential during a second period;

an encoder which encodes comparison results obtained by said comparators; and a control signal supply unit which generates one or more control signals that define the first period and the second period such as to make a duration of the first period different from a duration of the second period, and supplies the one or more control signals to said plurality of comparators, wherein each of the comparators includes an inverter which has an input thereof coupled to an output thereof only during the first period, and receives at the input a potential responsive to a difference between the analog input potential and the reference potential during the second period, said input of said inverter being coupled to a predetermined voltage during a third period different from both of the first period and the second period such as to prevent a through current from flowing through said inverter;

and wherein a processing cycle including sampling and comparing for a single analog input potential includes the first period, the second period, and the third period, and said input of said inverter is coupled to the predetermined voltage once in every said processing cycle.

2. The A/D converter as claimed in claim 1, wherein said control signal supply unit receives a clock signal, and generates a first control signal having a pulse width shorter than a HIGH period of the clock signal and a second control signal having a pulse width equal to that of the clock signal, said first control signal defining the first period and said second control signal defining the second period.

3. The A/D converter as claimed in claim 1, wherein each of the comparators includes:

a condenser;

an inverter connected to a first end of said condenser;

a first switch connecting between a second end of said condenser and the analog input potential;

a second switch connecting between the second end of said condenser and the reference potential; and a third switch which couples together an input of said inverter and an output of said inverter, wherein said first switch and said third switch are closed during the first period and said second switch is closed during the second period.

4. The A/D converter as claimed in claim 3, wherein each of said comparators further includes a fourth switch connecting between the first end of said condenser and a ground potential, and said control signal supply unit supplies to said comparators one or more control signals that close said fourth switch during a period in which all the first through third switches are open.

5. The A/D converter as claimed in claim 3, wherein each of said comparators further includes a fourth switch connecting between the second end of said condenser and a ground potential, and said control signal supply unit supplies to said comparators one or more control signals that close said fourth switch during a period in which all the first through third switches are open.

6. A system, comprising:

an A/D converter which converts an analog input signal into a digital signal;

a digital processing unit which processes the digital signal output from said A/D converter; and a pulse-width adjustment unit, wherein said A/D converter includes:

a plurality of comparators, each of which samples an analog input potential during a first period, and compares the analog input potential with a reference potential during a second period;

an encoder which encodes comparison results obtained by said comparators; and a control signal supply unit which generates one or more control signals that define the first period and the second period such as to make a duration of the first period different from a duration of the second period, and supplies the one or more control signals to said plurality of comparators, wherein said pulse-width adjustment unit is configured to adjust the duration of the first period, wherein each of the comparators includes an inverter which has an input thereof coupled to an output thereof only during the first period, and receives at the input a potential responsive to a difference between the analog input potential and the reference potential during the second period, said input of said inverter being coupled to a predetermined voltage during a third period different from both the first period and the second period such as to prevent a through current from flowing through said inverter;

and wherein a processing cycle including sampling and comparing for a single analog input potential includes the first period, the second period, and the third period, and said input of said inverter is coupled to the predetermined voltage once in every said processing cycle.

7. The system as claimed in claim 6, wherein said control signal supply unit receives a clock signal, and generates a first control signal having a pulse width shorter than a HIGH period of the clock signal and a second control signal having a pulse width equal to that of the clock signal, said first control signal defining the first period and said second control signal defining the second period.

8. The system as claimed in claim 6, wherein each of the comparators includes:

a condenser;

an inverter connected to a first end of said condenser;

a first switch connecting between a second end of said condenser and the analog input potential;

a second switch connecting between the second end of said condenser and the reference potential; and a third switch which couples together an input of said inverter and an output of said inverter, wherein said first switch and said third switch are closed during the first period and said second switch is closed during the second period.

9. The system as claimed in claim 8, wherein each of said comparators further includes a fourth switch connecting between the first end of said condenser and a ground potential, and said control signal supply unit supplies to said comparators one or more control signals that close said fourth switch during a period in which all the first through third switches are open.

10. The system as claimed in claim 8, wherein each of said comparators further includes a fourth switch connecting between the second end of said condenser and a ground potential, and said control signal supply unit supplies to said comparators one or more control signals that close said fourth switch during a period in which all the first through third switches are open.

11. A comparator which samples an analog input potential during a first period, and compares the analog input potential with a reference potential during a second period, comprising:

a condenser;

an inverter connected to a first end of said condenser;

a first switch connecting between a second end of said condenser and the analog input potential;

a second switch connecting between the second end of said condenser and the reference potential;

a third switch which couples together an input of said inverter and an output of said inverter, wherein said first switch and said third switch are closed only during the first period and said second switch is closed during the second period, the first period and the second period being controlled such as to have different lengths from each other; and a fourth switch connecting between the first end of said condenser and a predetermined fixed potential, wherein said fourth switch is closed during a third period different from both the first period and the second period such that the input of said inverter is fixed to the predetermined fixed potential to prevent a through current from flowing through said inverter during the third period, wherein a processing cycle including sampling and comparing for a single analog input potential includes the first period, the second period, and the third period, and said fourth switch is closed at least once in every said processing cycle.

12. The comparator as claimed in claim 11, wherein said fourth switch connects between the first end of said condenser and a ground potential that is the predetermined fixed potential, and closes during the third period in which all the first through third switches are open.

13. A comparator which samples an analog input potential during a first period, and compares the analog input potential with a reference potential during a second period, comprising:

a condenser;

an inverter connected to a first end of said condenser;

a first switch connecting between a second end of said condenser and the analog input potential;

a second switch connecting between the second end of said condenser and the reference potential;

a third switch which couples together an input of said inverter and an output of said inverter, wherein said first switch and said third switch are closed only during the first period and said second switch is closed during the second period, the first period and the second period being controlled such as to have different lengths from each other; and a fourth switch connecting between the second end of said condenser and a predetermined fixed potential, wherein said fourth switch is closed during a third period different from both the first period and the second period such that the input of said inverter is fixed to the predetermined fixed potential via said condenser to prevent a through current from flowing through said inverter during the third periods, wherein a processing cycle including sampling and comparing for a single analog input potential includes the first period, the second period, and the third period, and said fourth switch is closed at least once in every said processing cycle.

14. The comparator as claimed in claim 13, wherein said fourth switch connects between the second end of said condenser and a ground potential that is the predetermined fixed potential, and closes during the third period in which all the first through third switches are open.

* * * * *